(12) United States Patent
Ito et al.

(10) Patent No.: US 11,550,429 B2
(45) Date of Patent: Jan. 10, 2023

(54) LIQUID CRYSTAL DISPLAY DEVICE

(71) Applicant: Japan Display Inc., Tokyo (JP)

(72) Inventors: Tomoyuki Ito, Tokyo (JP); Kazuki Matsunaga, Tokyo (JP); Shigesumi Araki, Tokyo (JP); Kazuhide Mochizuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/557,757

(22) Filed: Dec. 21, 2021

(65) Prior Publication Data

US 2022/0221954 A1  Jul. 14, 2022

(30) Foreign Application Priority Data

Jan. 8, 2021 (JP) ............... JP2021-001999

(51) Int. Cl.
| | | |
|---|---|---|
| *G02F 1/135* | (2006.01) | |
| *G02F 1/1343* | (2006.01) | |
| *G02F 1/1335* | (2006.01) | |
| *G02F 1/1333* | (2006.01) | |
| *G06F 3/042* | (2006.01) | |

(Continued)

(52) U.S. Cl.
CPC ........ *G06F 3/0421* (2013.01); *G02F 1/13338* (2013.01); *G02F 1/13439* (2013.01); *G02F 1/133345* (2013.01); *G02F 1/133512* (2013.01); *G06F 3/0412* (2013.01); *H01L 27/14623* (2013.01); *H01L 27/14678* (2013.01); *G02F 1/1362* (2013.01)

(58) Field of Classification Search
CPC ........ G02F 1/13; G02F 1/133; G02F 1/13318; G02F 1/1333; G02F 1/13338; G02F 1/133331; G02F 1/133345; G02F 1/1335; G02F 1/133512; G02F 1/133514; G02F 1/1343; G02F 1/134309; G02F 1/13439; G02F 1/135; G02F 1/1351; G02F 1/1362; G02F 1/136209; G02F 1/1368; G06F 3/0421; G06F 3/0412; H01L 27/14623; H01L 27/14678

See application file for complete search history.

(56) References Cited

U.S. PATENT DOCUMENTS

| | | |
|---|---|---|
| 2003/0174870 A1 | 9/2003 | Kim et al. |
| 2018/0165497 A1 | 6/2018 | Lee et al. |

(Continued)

FOREIGN PATENT DOCUMENTS

| | | | | |
|---|---|---|---|---|
| CN | 111240065 | * | 6/2020 | ........... G02F 1/1333 |
| JP | 3840595 B2 | | 11/2006 | |
| JP | 6479151 B2 | | 3/2019 | |

*Primary Examiner* — Thoi V Duong
(74) *Attorney, Agent, or Firm* — Maier & Maier, PLLC

(57) ABSTRACT

According to one embodiment, a liquid crystal display device comprises first and second substrates and a liquid crystal layer. The first substrate includes a base member, a sensor between the base member and the liquid crystal layer, a collimation layer between the sensor and the liquid crystal layer, an insulating layer between the sensor and the collimation layer, an insulating layer, and a light shielding layer between the sensor and the base member. The sensor is configured to output a signal corresponding to light incident from a liquid crystal layer side. The light shielding layer overlaps with an outer peripheral part of the first collimation layer.

16 Claims, 10 Drawing Sheets

(51) Int. Cl.
    *H01L 27/146*     (2006.01)
    *G06F 3/041*     (2006.01)
    *G02F 1/1362*     (2006.01)

(56) References Cited

U.S. PATENT DOCUMENTS

2019/0087625 A1*   3/2019   Jia ........................ H01L 31/1013
2021/0110131 A1*   4/2021   Lin ................... H01L 27/14623

* cited by examiner

LIQUID CRYSTAL DISPLAY DEVICE

CROSS-REFERENCE TO RELATED APPLICATIONS

This application is based upon and claims the benefit of priority from Japanese Patent Application No. 2021-001999, filed Jan. 8, 2021, the entire contents of which are incorporated herein by reference.

FIELD

Embodiments described herein relate generally to a liquid crystal display device.

BACKGROUND

In recent years, liquid crystal display devices storing sensors to read biometric information such as a fingerprint sensor, a vein sensor, and the like have been developed. The sensors may be optical sensors using, for example, photoelectric conversion elements. Above the sensors, one or more collimation layers to block diagonal incident light are arranged.

The sensors detect light from a light source such as a backlight and reflected by a target object. The light going toward the target object may be reflected by the back surface of the collimation layer, and if the reflection light is incident on the sensor, noise will occur, and accuracy of detection will decrease.

DETAILED DESCRIPTION

Figure 1:
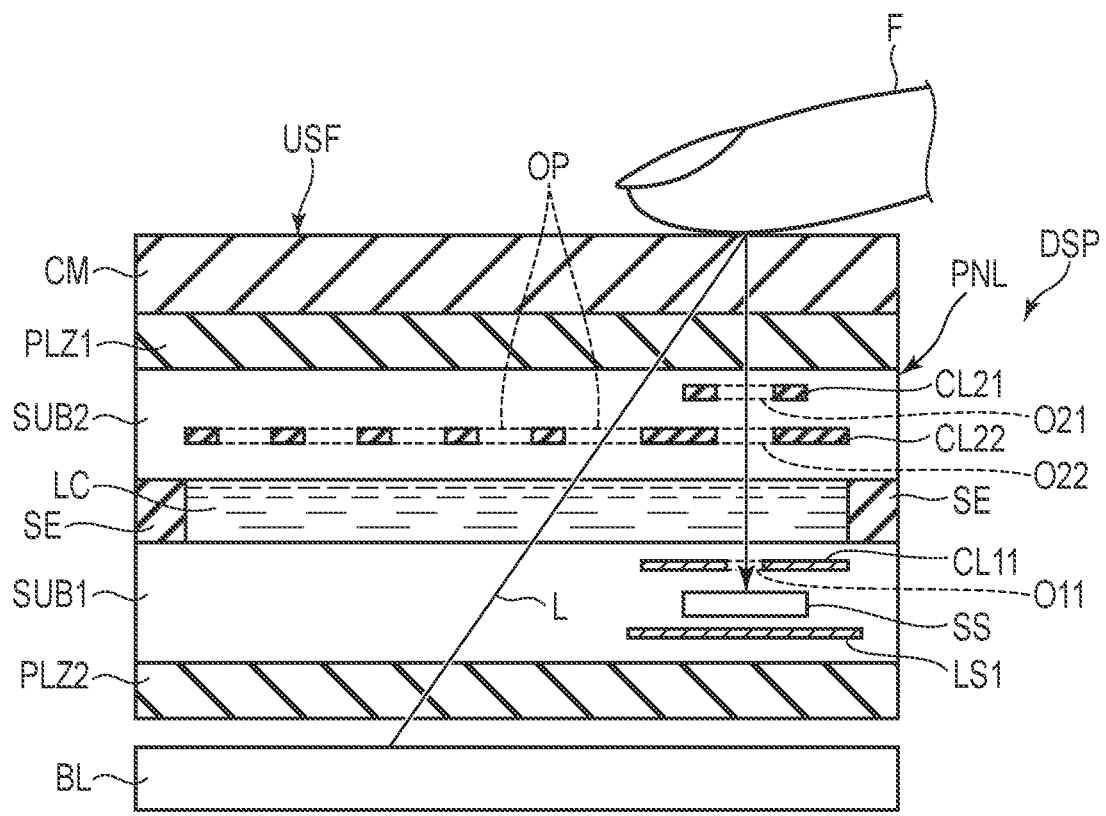
FIG. 1 is a schematic diagram of a display device of a first embodiment.

In general, according to an embodiment, a liquid crystal display device comprises a first substrate, a second substrate opposed to the first substrate, and a liquid crystal layer between the first substrate and the second substrate. The first substrate includes a base member, a sensor, a first collimation layer, an insulating layer, an insulating layer, and a light shielding layer. The sensor is positioned between the base member and the liquid crystal layer in a display area with pixels, and is configured to output a detection signal corresponding to light incident from a liquid crystal layer side. The first collimation layer is positioned between the sensor and the liquid crystal layer, and has a first opening overlapping with the sensor. The insulating layer is positioned between the sensor and the first collimation layer. The light shielding layer is positioned between the sensor and the base member, and overlaps with an outer peripheral part of the first collimation layer.

According to another embodiment, the first substrate includes a base member, a sensor, a first collimation layer, a second collimation layer, and an insulating layer. The sensor is positioned between the base member and the liquid crystal layer in a display area with pixels, and is configured to output a detection signal corresponding to light incident from a liquid crystal layer side. The first collimation layer is positioned between the sensor and the liquid crystal layer, and has a first opening overlapping with the sensor. The second collimation layer is positioned between the sensor and the first collimation layer, and covers a surface of the sensor and having a second opening overlapping with the first opening. The insulating layer is positioned between the first collimation layer and the second collimation layer.

According to yet another embodiment, the first substrate includes a base member, a sensor, a first collimation layer, and an insulating layer. The sensor is positioned between the base member and the liquid crystal layer in a display area with pixels, and is configured to output a detection signal corresponding to light incident from a liquid crystal layer side. The first collimation layer is positioned between the sensor and the liquid crystal layer, and has a first opening overlapping with the sensor. The insulating layer is positioned between the sensor and the first collimation layer. The first collimation layer includes an inclined part extending toward the sensor. The inclined part surrounds the first opening.

With such structures, accuracy of detection of the sensors of the liquid crystal display device can be increased.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

FIG. 1 is a schematic diagram of a liquid crystal display device DSP (display device DSP) of a first embodiment. The display device DSP includes a display panel PNL, cover member CM, first polarizer PLZ1, second polarizer PLZ2, and illumination device BL.

The display panel PNL is a liquid crystal display panel, and includes a first substrate SUB1, second substrate SUB2 opposed to the first substrate SUB1, sealant SE, and liquid crystal layer LC. The liquid crystal layer LC is sealed between the first substrate SUB1 and the second substrate SUB2 by the sealant SE. The display panel PNL of the present embodiment is a transmissive type which displays an image by selectively transmitting the light from the back surface side of the first substrate SUB1 to the upper surface side of the second substrate SUB2.

The first substrate SUB1 includes a sensor SS, and collimation layer CL11 (first collimation layer), and light shielding layer LS1. The sensor SS is positioned between the collimation layer CL11 and the light shielding layer LS1. The collimation layer CL11 is positioned between the sensor SS and the liquid crystal layer LC.

In the present embodiment, the collimation layer CL11 is formed of a metal material which is opaque. Thus, the collimation layer CL11 may be referred to as a metal layer or a light shielding layer. Furthermore, the light shielding layer LS1 is formed of a metal material in the present embodiment. Thus, the light shielding layer LS1 may be referred to as a metal layer.

The second substrate SUB2 includes collimation layers CL21 and CL22. The collimation layer CL22 is positioned closer to the liquid crystal layer LC than is the collimation layer CL21. The collimation layers CL21 and CL22 are formed of, for example, a black resin which is opaque. The collimation layers CL21 and CL22 may be referred to as light shielding layers.

The collimation layer CL11 includes an opening O11 (first opening) overlapping the sensor SS. The collimation layer CL21 includes an opening O21 overlapping with the sensor SS. The collimation layer CL22 includes an opening O22 overlapping with the sensor SS. Furthermore, the collimation layer CL22 includes a pixel opening OP in a position which does not overlap with the sensor SS. The openings O11, O21, and O22 overlap with each other. For example, the opening O11 is smaller than the openings O21 and O22, and the openings O21 and O22 are the same in size.

The sealant SE adheres the first substrate SUB1 and the second substrate SUB2 together. Between the first substrate SUB1 and the second substrate SUB2, a certain cell gap is defined by spacers which are not shown. The liquid crystal layer LC is charged in the cell gap.

The cover member CM is disposed on the display panel PNL. For example, the cover member CM is a glass substrate or a resin substrate. The cover member CM includes an upper surface USF to which a target object of detection by the sensor SS touches. In the example of FIG. 1, a finger which is an example of the target object is touching the upper surface USF. The first polarizer PLZ1 is disposed between the display panel PNL and the cover member CM.

The illumination device BL is disposed below the display panel PNL, and emits light L onto the first substrate SUB1. The illumination device BL is, for example, a side edge type back light, and includes a plate-like light guide material and a plurality of light sources which emit light to the side surface of the light guide material. The second polarizer PLZ2 is disposed between the display panel PNL and the illumination device BL.

Part of the light L reflected by the finger F, that is, the reflection light passes through the openings O21, O22, and O11 in this order and is incident on the sensor SS. That is, the reflection light reflected by the finger F passes the cover member CM, first polarizer PLZ1, second substrate SUB2, liquid crystal layer LC, and the part of the first substrate SUB1 above the sensor SS before being incident on the sensor SS.

The sensor SS outputs a detection signal corresponding to the incident light. As will be described later, the display panel PNL includes a plurality of sensors SS, and can detect asperity of the surface of the finger F (for example, fingerprint) based on the detection signals output from the sensors SS.

In order to acquire more accurate detection signals, the sensor SS is desired to detect incident light parallel to the normal of the upper surface USF. The collimation layers CL11, CL21, and CL22 function as collimators which parallel the light incident on the sensors SS. That is, the light inclined with respect to the normal of the upper surface USF of the collimation layers CL11, CL21, and CL22 is cut.

With the aforementioned sensors SS of the display device DSP, the display device DSP can achieve a function of fingerprint sensor. Furthermore, in addition to or instead of the detection of fingerprints, the sensor SS may be used to detect other biometric information based on the light reflected inside the finger F. The biometric information is, for example, a blood vessel image such as vein, a pulse, or a pulse wave.

Figure 2:
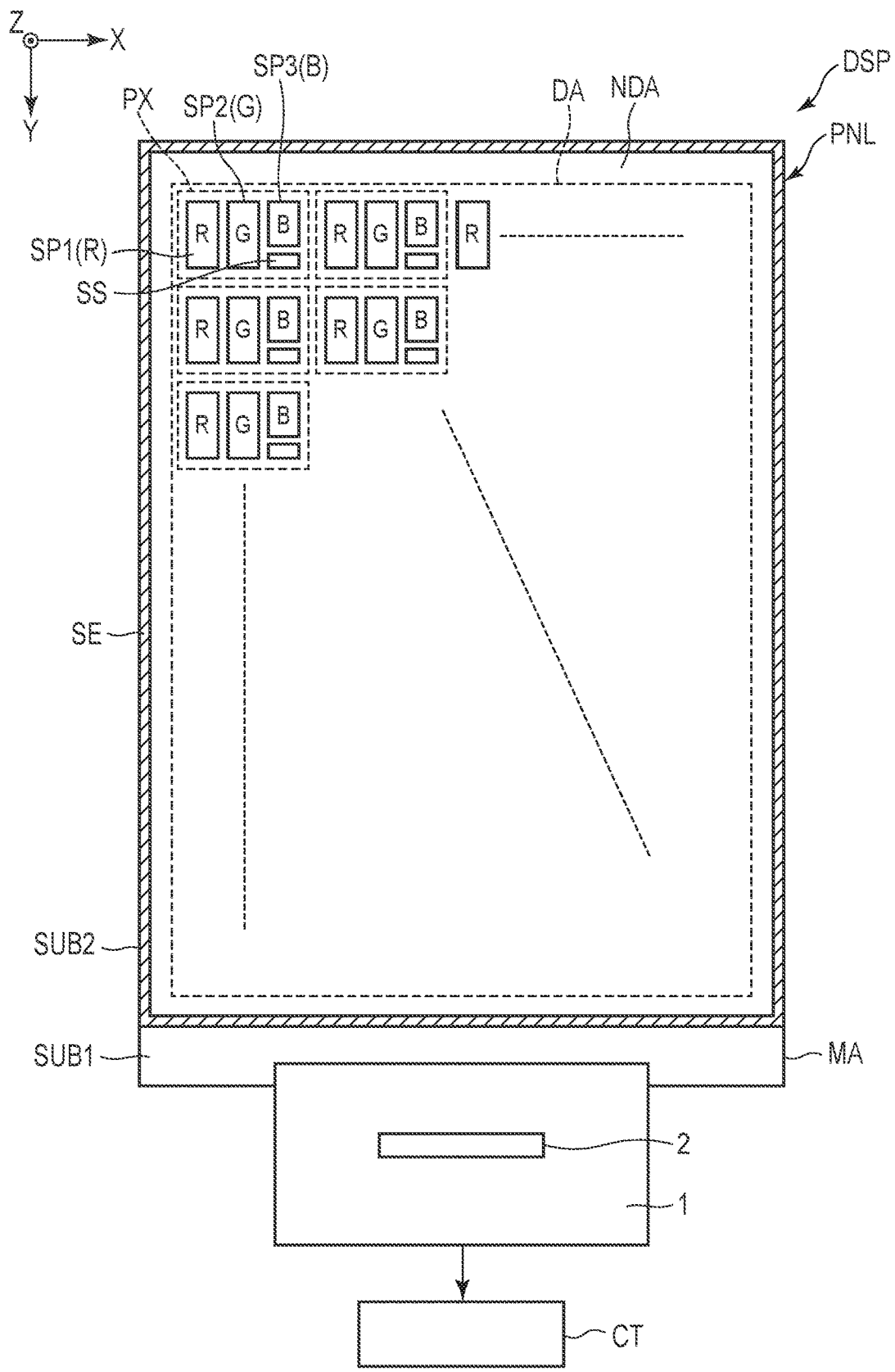
FIG. 2 is a schematic plan view of the display device of the first embodiment.

FIG. 2 is a schematic plan view of the display device DSP of the present embodiment. As in FIG. 2, a first direction X, a second direction Y, and a third direction Z will be defined. For example, the first direction X, second direction Y, and third direction Z are orthogonal to each other while they may cross each other at an angle other than 90 degrees. The first direction X and the second direction Y correspond to the directions parallel to the main surface of each substrate included in the display device DSP, and the third direction Z corresponds to the thickness direction of the display device DSP. In the present application, the direction toward the tip of the arrow representing the third direction Z may be referred to as above, and the opposite direction thereof may be referred to as below. Furthermore, seeing the display device DSP and structural elements thereof parallel to the third direction Z will be referred to as plan view.

The display device DSP includes the aforementioned display panel PNL and a wiring substrate 1 mounted on the display panel PNL. The display panel PNL includes a display area DA to display an image and a non-display area NDA (peripheral area) surrounding the display area DA.

The first substrate SUB1 includes a mount area MA which does not overlap with the second substrate SUB2. The sealant SE is positioned in the non-display area NDA. In FIG. 2, the area where the sealant SE is arranged is hatched. The display area DA is positioned inside the sealant SE. The display panel PNL includes, in the display area DA, a plurality of pixels PX arranged in a matrix in the first direction X and the second direction Y.

A pixel PX includes a subpixel SP1 which emits red (R) light, subpixel SP2 which emits green (G) light, and subpixel SP3 which emits blue (B) light. Note that the pixel PX may include a subpixel which emits light other than red, green, and blue.

In the example of FIG. 2, one sensor SS is provided with each pixel PX. In the display area DA, the sensors SS are arranged in a matrix in the first direction X and the second direction Y.

The sensor SS is not necessarily provided with every pixel PX. For example, one sensor SS may be arranged with respect to several pixels PX. Furthermore, the sensors SS may be arranged with respect to pixels PX of a part of the display area DA while being omitted in the other part of the area.

The wiring substrate 1 is, for example, a flexible printed circuit, and is connected to a terminal part of the mount area MA. Furthermore, the wiring substrate 1 includes a driver 2 configured to drive the display panel PNL. Note that, the driver 2 may be mounted in the other position of the mount area MA or the like. For example, the driver 2 includes an IC to control display operation by each pixel PX, and an IC to control detection operation by the sensor SS. The ICs may be mounted in different positions. The detection signals output from the sensors SS are output to a controller CT through the wiring substrate 1 and the driver 2. The controller CT executes calculation or the like to detect a fingerprint based on the detection signals from the sensors SS.

Figure 3:
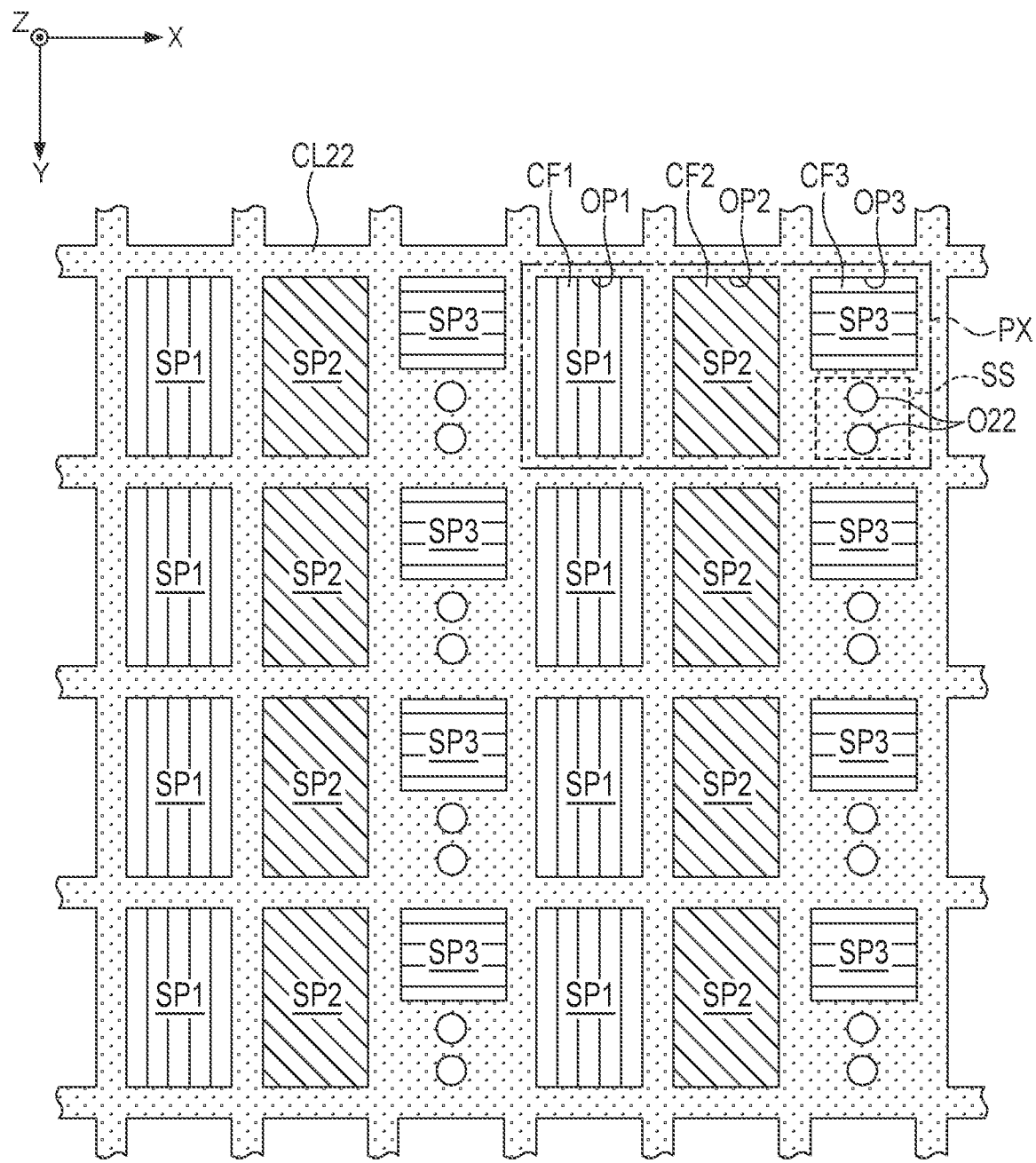
FIG. 3 is a schematic plan view of an example of a layout of pixels of the first embodiment.

FIG. 3 is a schematic plan view of an example of a layout of pixels PX. The aforementioned collimation layer CL22 includes a pixel opening OP1 in the subpixel SP1, pixel opening OP2 in the subpixel SP2, and pixel opening OP3 in the subpixel SP3. The pixel openings OP1, OP2, and OP3 are examples of the pixel opening OP of FIG. 1.

Furthermore, the collimation layer CL22 includes two openings O22 overlapping with the sensor SS in each pixel PX. Two openings O22 are aligned in the second direction Y. Note that the number of openings O22 overlapping one sensor SS is not limited to two, and may be one or may be three or more. The openings O22 overlapping with one sensor SS may not be aligned in the second direction Y, and may be aligned in various ways.

The collimation layer CL22 is arranged in borders of the subpixels SP1, SP2, and SP3, and is shaped as a lattice as a whole. Such a collimation layer CL22 may be referred to as a black matrix.

In the example of FIG. 3, the pixel openings OP1, OP2, and OP3 are arranged in this order in the first direction X. The width of the pixel opening OP3 in the second direction Y is smaller than the widths of the pixel openings OP1 and OP2. The opening O22 is arranged in the space formed thereby. The opening O22 is arranged in the first direction X with the pixel opening OP2, and is arranged in the second direction Y with the pixel opening OP3.

A red color filter CF1 is arranged in the subpixel SP1, a green color filter CF2 is arranged in the subpixel SP2, and a blue color filter CF3 is arranged in the subpixel SP3. The color filters CF1, CF2, and CF3 overlap with the pixel openings OP1, OP2, and OP3, respectively. On the other hand, the opening O22 does not overlap with the color filter CF1, CF2, or CF3.

The opening O22 is, for example, a circle as depicted. Note that, the shape of the opening 22 is not limited thereto, and may be a rectangle or the like. The openings O11 and O21 in FIG. 1 are shaped the same as the opening O22.

Figure 4:
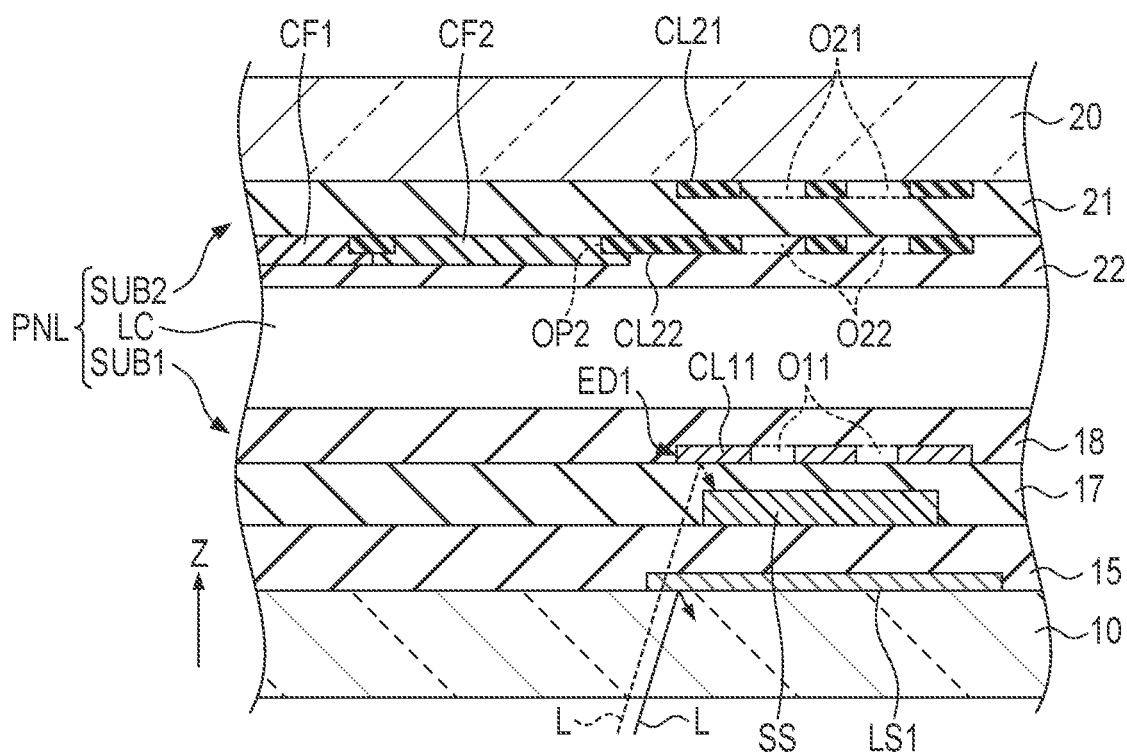
FIG. 4 is a schematic cross-sectional view of a display panel of the first embodiment.

FIG. 4 is a schematic cross-sectional view of the display panel PNL. The first substrate SUB1 includes, in addition to the aforementioned sensor SS, collimation layer CL11, and light shielding layer LS1, a transparent first base member 10, and insulating layers 15, 17, and 18.

The first base member 10 is, for example, a glass substrate or a resin substrate. The insulating layers 15, 17, and 18 are formed of, for example, an organic material, and are layered on the first base member 10 in this order. The light shielding layer LS1 is positioned between the first base member 10 and the insulating layer 15. The sensor SS is positioned between the insulating layers 15 and 17. The collimation layer CL11 is positioned between the insulating layers 17 and 18.

The second substrate SUB2 includes, in addition to the collimation layers CL21 and CL22 and the color filters CF1, CF2, and CF3, a transparent second base member 20, insulating layer 21, and overcoat layer 22.

The second base member 20 is, as with the first base member 10, a glass substrate or a resin substrate. The insulating layer 21 and the overcoat layer 22 is formed of, for example, an organic material, and are layered below the second base member 20 in this order. The insulating layer 21 may be structured as an organic material layer and an inorganic material layer stacked together. The collimation layer CL21 is positioned between the second base member 20 and the insulating layer 21. The collimation layer CL22 and the color filters CF1, CF2, and CF3 may be positioned between the insulating layer 21 and the overcoat layer 22.

The collimation layer CL11 overlaps with the entirety of the sensor SS in the third direction Z except for the part of the opening O11. The light shielding layer LS1 overlaps with the entirety of the sensor SS and the collimation layer CL11 in the third direction Z.

In the example of FIG. 4, the width of the light shielding layer LS1 is greater than the width of the collimation layer CL11. Thus, an outer peripheral part ED1 of the collimation layer CL11 overlaps with the light shielding layer LS1 in the third direction Z.

Light L represented by a dotted arrow and light L represented by a solid arrow are emitted from the illumination device BL and are greatly inclined with respect to the third direction Z. If the width of the light shielding layer LS1 is smaller than the example of FIG. 4, the light emitted from the illumination device BL is reflected by the lower surface of the collimation layer CL11 to be incident on the sensor SS as the light L depicted in the dotted line. When such light is incident thereon, noise may occur in the detection signals output from the sensors SS, and accuracy of the detection by the sensors SS may decrease.

On the other hand, if the light shielding layer LS1 is large enough to overlap with the outer peripheral part ED1 of the collimation layer CL11 as in FIG. 4, the light emitted from the illumination device BL is reflected or absorbed by the light shielding layer LS1 as with the light L depicted in the solid line. Thus, light reflected by the lower surface of the collimation layer CL11 to be incident on the sensor SS does not occur or such light is reduced.

Structures applicable to the first substrate SUB1 will be explained with reference to FIGS. 5 and 6. Note that, FIGS. 5 and 6 are schematic diagrams of the structure of the first substrate SUB1 in a cross-sectional view and a plan view, respectively, and therein, positional relationships and shapes of the elements in the both figures may not necessarily match.

Figure 5:
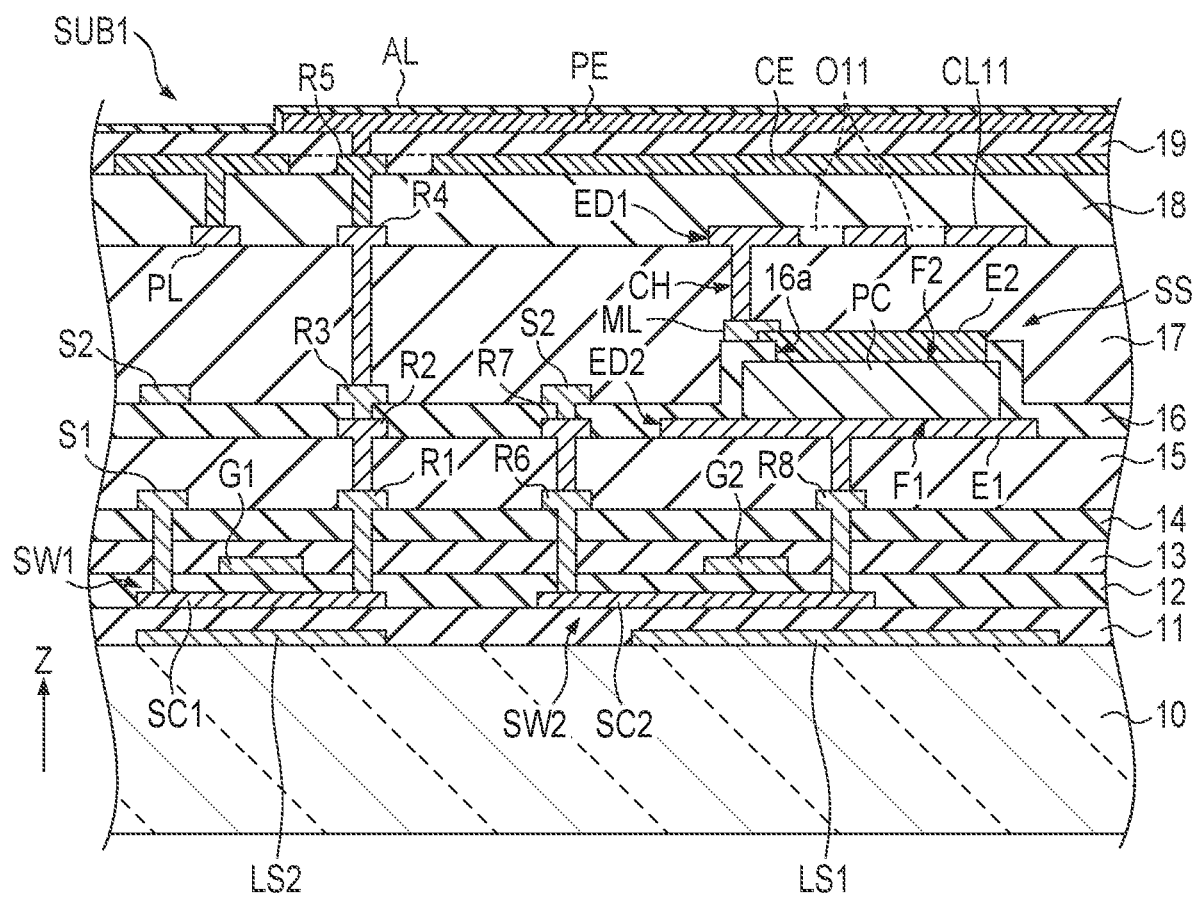
FIG. 5 is a schematic cross-sectional view of an example of the structure applicable to a first substrate of the first embodiment.
Figure 6:
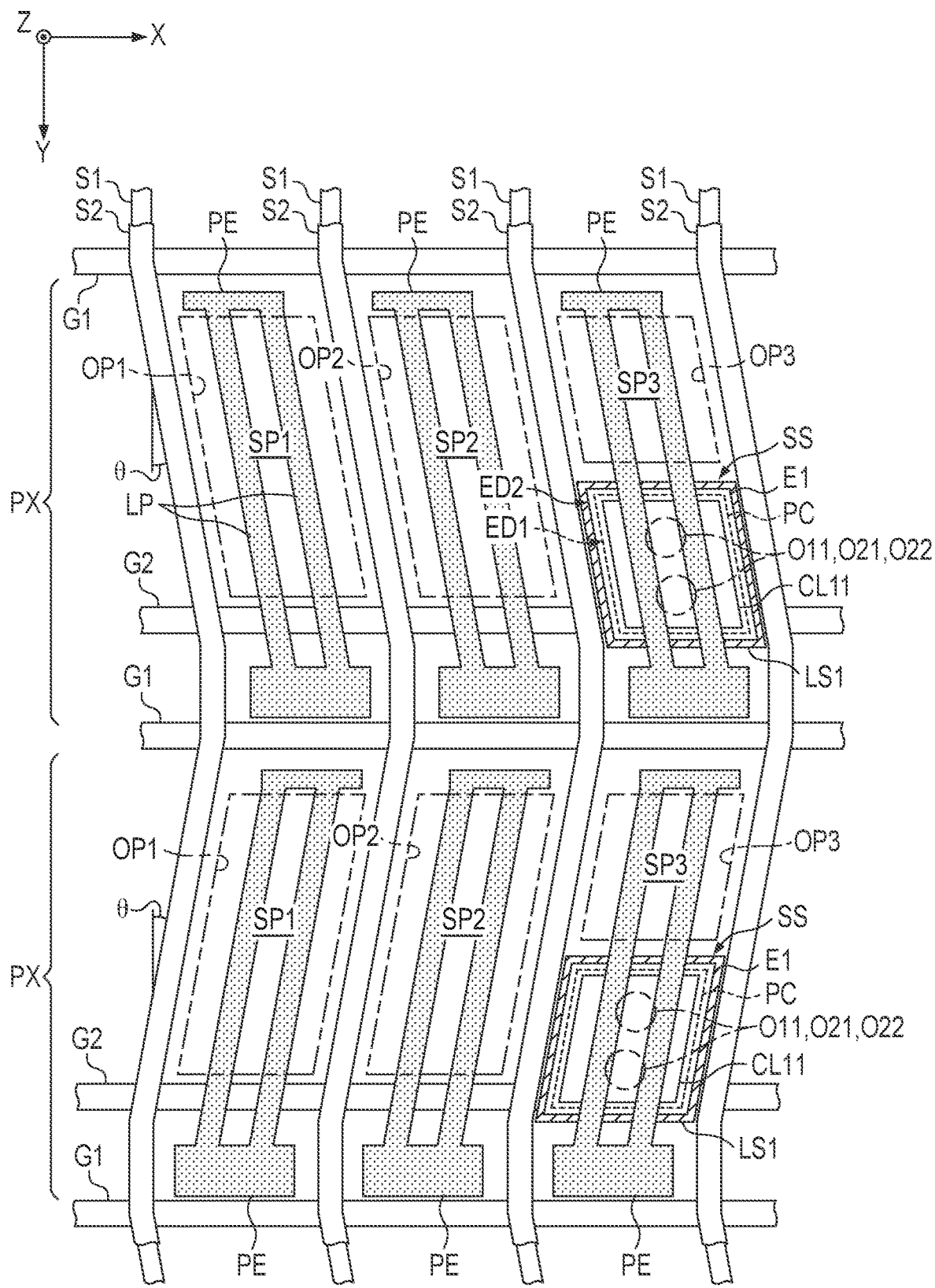
FIG. 6 is a schematic plan view of elements arranged in the first substrate of the first embodiment.

FIG. 5 is a schematic cross-sectional view of an example of the structure applicable to the first substrate SUB1. The first substrate SUB1 includes, in addition to the insulating layers 15, 17, and 18 of FIG. 4, insulating layers 11, 12, 13, 14, 16, and 19 formed of an inorganic material, and an alignment film AL. The insulating layers 11, 12, 13, 14, 15, 16, 17, 18, and 19 and the alignment film AL are layered in the third direction Z in this order above the first base member 10.

The first substrate SUB1 includes, as elements related to image display, a signal line S1, scan line G1, switching element SW1, pixel electrode PE, common electrode CE, relay electrodes R1, R2, R3, R4, and R5, and power line PL. The pixel electrode PE and the switching element SW1 are provided with each of the subpixels SP1, SP2, and SP3. The common electrode CE is provided with several subpixels SP1, SP2, and SP3, for example.

The switching element SW1 includes a semiconductor layer SC1. The semiconductor layer SC1 is disposed between the insulating layer 11 and 12. The scan line Cl is disposed between the insulating layers 12 and 13 to be opposed to the semiconductor layer SC1. The signal line S1 is disposed between the insulating layers 14 and 15 and contact the semiconductor layer SC1 through a contact hole passing through the insulating layers 12, 13, and 14.

In the example of FIG. 5, a light shielding layer LS2 is disposed between the first base member 10 and the insulating layer 11. At least the part of the semiconductor layer SC1 opposed to the scan line G1 is opposed to the light shielding layer LS2.

The relay electrode R1 is disposed between the insulating layer 14 and 15, and contacts the semiconductor layer SC1 through a contact hole passing through the insulating layers 12, 13, and 14. The relay electrode R2 is disposed between insulating layers 15 and 16, and contacts the relay electrode R1 through a contact hole passing through the insulating layer 15. The relay electrode R3 is disposed between the insulating layers 16 and 17, and contacts the relay electrode R2 through a contact hole passing through the insulating layer 16. The relay electrode R4 is disposed between the insulating layers 17 and 18, and contacts the relay electrode R3 through a contact hole passing though the insulating layer 17. The relay electrode R5 is disposed between the insulating layers 18 and 19, and contacts the relay electrode R4 through a contact hole passing through the insulating layer 18.

The pixel electrode PE is disposed between the insulating layer 19 and the alignment film AL, and contacts the relay electrode R5 through a contact hole passing through the insulating layer 19. The power line PL is disposed between the insulating layers 17 and 18. The common electrode CE is disposed between the insulating layers 18 and 19, and contacts the power line PL through a contact hole passing through the insulating layer 18.

A common voltage is supplied to the power line PL. The common voltage is applied to the common electrode CE. An image signal is supplied to the signal line S1, and a scan signal is supplied to the scan line G1. When the scan signal is supplied to the scan line G1, the image signal of the signal line S1 is applied to the pixel electrode PE through the semiconductor layer SC1 and the relay electrodes R1, R2, R3, R4, and R5. At that time, an electric field is generated because of a potential difference between the common voltage and the image signal between the pixel electrode PE and the common electrode CE, and the field effects the liquid crystal layer LC.

The first substrate SUB1 includes, in addition to the aforementioned light shielding layer LS1 and collimation layer CL11, a signal line S2, scan line G2, switching element SW2, relay electrodes R6, R7, and R8, and metal layer ML as elements related to the sensor SS. Furthermore, the sensor SS includes a first electrode E1 (lower electrode), second electrode E2 (upper electrode), and photoelectric conversion element PC.

The light shielding layer LS1 is disposed between the first base member 10 and the insulating layer 11. The switching element SW2 includes a semiconductor layer SC2. The semiconductor layer SC2 is disposed between the insulating layers 11 and 12. The scan line G2 is disposed between the insulating layers 12 and 13 to be opposed to the semiconductor layer SC2. At least the part of the semiconductor layer SC2 opposed to the scan line G2 is opposed to the light shielding layer LS1.

The relay electrode R6 is disposed between the insulating layers 14 and 15, and contacts the semiconductor layer SC2 through a contact hole passing through the insulating layers 12, 13, and 14. The relay electrode R7 is disposed between the insulating layers 15 and 16, and contacts the relay electrode R6 through a contact hole passing through the insulating layer 15. The signal line 2 is disposed between the insulating layers 16 and 17, and contacts the relay electrode R7 through a contact hole passing through the insulating layer 16. The relay electrode R8 is disposed between the insulating layers 14 and 15, and contacts the semiconductor layer SC2 through a contact hole passing through the insulating layers 12, 13, and 14.

The photoelectric conversion element PC includes a first surface F1 opposed to the first base member 10, and a second surface F2 opposed to the liquid crystal layer LC. The photoelectric conversion element PC is positioned between the insulating layers 15 and 16. The first electrode E1 is disposed between the photoelectric conversion element PC and the insulating layer 15, and contacts the first surface F1. The outer peripheral part ED2 of the first electrode E1 protrudes from the photoelectric conversion element PC, and is covered with the insulating layer 16. The first electrode E1 contacts the relay electrode R8 through a contact hole passing through the insulating layer 15 below the photoelectric conversion element PC.

The insulating layer 16 includes an opening 16a above the photoelectric conversion element PC. The second electrode E2 is disposed between the photoelectric conversion element PC and the insulating layer 17, and contacts the second surface F2 through the opening 16a. The second electrode E2 is partially positioned between the insulating layers 16 and 17.

The metal layer ML is positioned between the insulating layers 16 and 17 above the photoelectric conversion element PC. The metal layer ML contacts the part of the first electrode E1 positioned between the insulating layers 16 and 17.

The collimation layer CL11 is disposed between the insulating layers 17 and 18. In the example of FIG. 5, the collimation layer CL11 contacts the metal layer ML through a contact hole CH passing through the insulating layer 17. That is, the collimation layer CL11 is electrically connected to the second electrode E2.

The light shielding layers LS1 and LS2 are formed of the same metal material. The signal line S1 and the relay electrodes R1, R6, and R8 are formed of the same metal material. The scan lines G1 and G2 are formed of the same metal material. The first electrode E1 and the relay electrodes R2 and R7 are formed of the same metal material. The signal line S2, metal layer ML, and the relay electrode R3 are formed of the same metal material. The collimation layer CL11, power line PL, and relay electrode R4 are formed of the same metal material. The second electrode E2, pixel electrode PE, and common electrode CE are formed of transparent conductive material such as indium tin oxide (ITO).

The first electrode E1 formed of a metal material functions as a light shielding layer, and suppresses light from the below to be incident on the photoelectric conversion element PC. The photoelectric conversion element PC is, for example, a photodiode to output electric signals (detection signals) corresponding to the incident light. Specifically, the photoelectric conversion element PC is a positive intrinsic negative (PIN) photodiode. Such a photodiode includes p-type semiconductor layer, i-type semiconductor layer, and n-type semiconductor layer. The p-type semiconductor layer is positioned in the second electrode E2 side, the n-type semiconductor layer is positioned in the first electrode E1 side, and the i-type semiconductor layer is positioned between the p-type semiconductor layer and the n-type semiconductor layer.

The p-type semiconductor layer, i-type semiconductor layer, and n-type semiconductor layer are formed of, for example, amorphous silicon (a-Si). Note that, the material for the semiconductor layers is not limited thereto, and amorphous silicon may be replaced with polycrystalline silicon or microcrystalline silicon, for example, or polycrystalline silicon may be replaced with amorphous silicon or microcrystalline silicon, for example.

To the scan lien G2, a scan signal is supplied at a time to perform detection by the sensor SS. When the scan signal is supplied to the scan line G2, a detection signal generated by the photoelectric conversion element PC is output to the signal line S2 through the first electrode E1, relay electrode R8, semiconductor layer SC2, and relay electrodes R6 and R7. The detection signal output to the signal line S2 is output to the controller CT through the driver 2, for example.

As described above, the outer peripheral part ED1 of the collimation layer CL11 overlaps with the light shielding layer LS1 in the third direction Z. Furthermore, in the example of FIG. 5, the outer peripheral part ED2 of the first electrode E1 also overlaps with the light shielding layer LS1 in the third direction Z.

FIG. 6 is a schematic plan view of elements arranged in the first substrate SUB1. In this example, the structure of two pixels PX arranged in the second direction Y is shown. Elements other than the scan lines G1 and G2, signal lines S1 and S2, pixel electrode PE, light shielding layer LS1, collimation layer CL11, first electrode E1, and photoelectric conversion element PC are omitted. Note that, in the example of FIG. 6, the subpixels SP1, SP2, and SP3 are inclined with respect to the second direction Y. As with the example of FIG. 3, the subpixels SP1, SP2, and SP3 may not be inclined with respect to the second direction Y.

One scan line G1 is disposed between each pair of pixels PX arranged in the second direction Y. One signal line S1 is disposed between subpixels SP1 and SP2, SP2 and SP3, and SP3 and SP1 arranged in the first direction X. The scan line G1 extends in the first direction X. The signal line S1 extends in the second direction Y while bending.

The pixel electrodes PE of the subpixels SP1, SP2, and SP3 of one pixel PX are shaped the same. Each pixel electrode PE arranged in an area defined by two scan lines G1 and two signal lines S1. In the example of FIG. 6, the pixel electrode PE includes two line parts LP arranged in the first direction X. The aforementioned pixel openings OP1, OP2, and OP3 overlap with the line parts LP of the pixel electrode PC of the subpixels SP1, SP2, and SP3, respectively.

The scan line G2 extends, between two scan lines G1 adjacent to each other in the second direction Y, in the first direction X. The scan line G2 does not overlap with the pixel opening OP1, OP2, or OP3. That is, the scan line G2 overlaps with the collimation layer CL22. The signal line S2 is, as with the signal line S1, arranged each space between the subpixels SP1, SP2, and SP3 arranged in the first direction X. In the example of FIG. 6, the signal lines S1 and S2 overlap with each other.

The light shielding layer LS1, collimation layer CL11, and sensor SS (first electrode E1 and photoelectric conversion element PC, and the like) are arranged in the area defined by two scan lines G1 and two signal lines S1. The light shielding layer LS1, collimation layer CL11, first electrode E1, and photoelectric conversion element PC are positioned between the pixel opening OP3 and the scan line G1 in the second direction Y, and overlap with the scan line G2. The light shielding layer LS1, collimation layer CL11, first electrode E1, and photoelectric conversion element PC overlap with the line part LP of the pixel electrode PE of the subpixel SP3. The openings O11, O21, and O22 overlap with the photoelectric conversion element PC, and partly overlap with the line part LP.

In the pixel PX in the upper half, the signal lines S1 and S2, line part LP, light shielding layer LS1, collimation layer CL11, first electrode E1, and photoelectric conversion element PC are inclined counter clockwise with respect to the second direction Y to form an angle θ. Furthermore, in the pixel PX in the lower half, the signal lines S1 and S2, line part LP, light shielding layer LS1, collimation layer CL11, first electrode E1, and the photoelectric conversion element PC are inclined clockwise with respect to the second direction Y to form an angle θ. Thus, a pseudo-multi-domain structure is achieved in the pixels PX of the upper and lower halves.

In a plan view, the size of the light shielding layer LS1 is greater than the size of the collimation layer CL11, photoelectric conversion element PC, and first electrode E1. Thus, the entirety of the collimation layer CL11, photoelectric conversion element PC, and first electrode E1 overlaps with the light shielding layer LS1. From a different viewpoint, the outer peripheral part ED1 of the collimation layer CL11 and the outer peripheral part ED2 of the first electrode E1 overlap with the light shielding layer LS1 over the entire periphery.

According to the present embodiment, with the sensor SS arranged in the display area DA, the display device DSP configured to detect a target object contacting or approaching the display area DA can be presented. Furthermore, the light shielding layer LS1 overlapping with the outer peripheral part ED1 of the collimation layer CL11 is arranged below the sensor SS, and thus, the light from the illumination device BL is reflected by the lower surface of the collimation layer CL11, and light being incident on the sensor SS is suppressed. Therefore, noise in the detection signals output from the sensor SS is reduced, and accuracy of detection by the sensor SS is improved.

In the present embodiment, the light shielding layer LS1 overlaps with the outer peripheral part ED2 of the first electrode E1 of the sensor SS. In such a structure, even if the size of the first electrode E1 which is formed of a metal material and is opaque is not sufficiently large, the light which may be recognized as noise can suitably cut by the light shielding layer LS1. Especially, the size of the first electrode E1 is greatly restricted when the sensor SS is arranged in the pixel PX as in the present embodiment, and thus, the above advantage becomes significant.

In the present embodiment, the sensor SS, collimation layer CL11, and light shielding layer LS1 overlap with the pixel electrode PE. With such a structure, the structure of subpixels in which the pixel electrode PE is disposed is not necessarily differentiated from the other subpixels. When the pixel electrode PE of the subpixel SP3 and the sensor SS overlap with each other as in the present embodiment, the pixel opening OP3 of the subpixel SP3 must be formed small. In relation to this point, the effect of the size of the blue subpixel SP3 to the display quality is less than the effect of the size of the red and green subpixels SP1 and SP2 to the display quality.

In the present embodiment, the collimation layer CL11 contacts the metal layer ML through a contact hole CH. Thus, a potential difference is not formed between the collimation layer CL11, metal layer ML, and second electrode E2, and noise caused by the potential difference to mix in the detection signals output from the sensors SS can be suppressed.

In addition to the above advantages, various favorable advantages can be achieved by the present embodiment. Furthermore, the structure disclosed in the present application may be changed in various forms. Some examples of the variants will be explained below.

Figure 7:
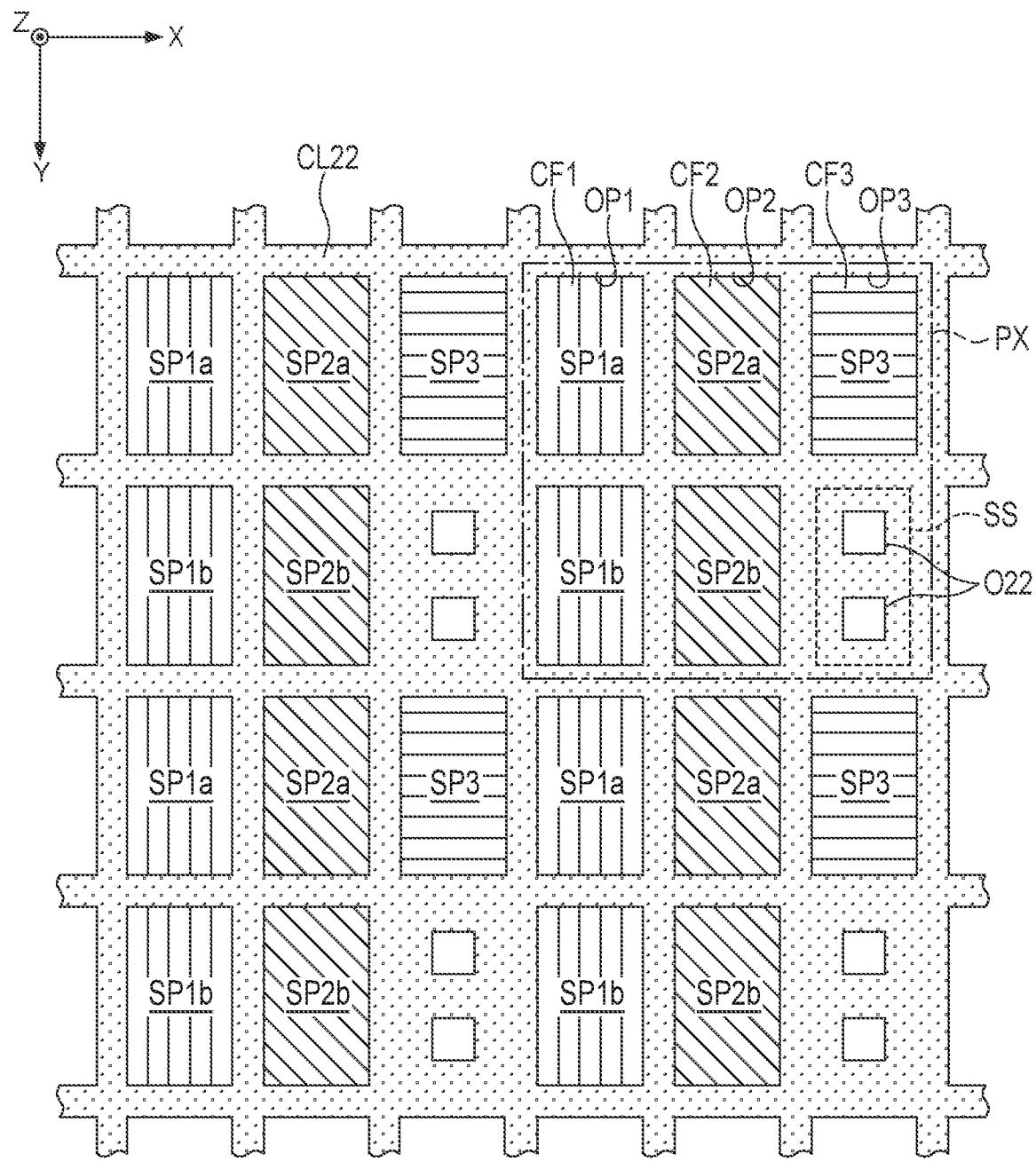
FIG. 7 is a schematic plan view of another example of the layout of pixels.

FIG. 7 is a schematic plan view of another example of the layout of the pixels PX. In the example of FIG. 7, the pixel PX includes two subpixels SP1*a* and SP1*b* arranged in the second direction Y, two subpixels SP2*a* and SP2*b* arranged in the second direction Y, and one subpixel SP3. The subpixels SP1*a*, SP2*a*, and SP3 are arranged in the first direction X. The subpixels SP1*b* and SP2*b*, and the sensor SS are arranged in the first direction X. Furthermore, in the example of FIG. 7, the opening O22 is a rectangle. The opening O22 may be a circle as in the example of FIG. 3.

Figure 8:
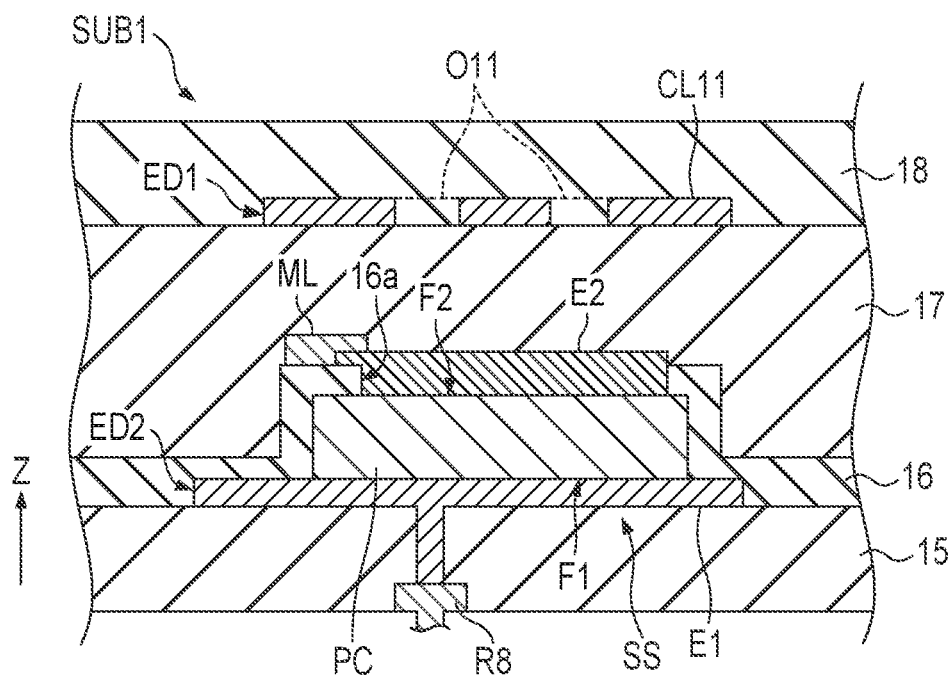
FIG. 8 is a schematic cross-sectional view of another structure applicable to the first substrate.

FIG. 8 is a schematic cross-sectional view of another structure applicable to the first substrate SUB1. In the example depicted, the collimation layer CL11 is not connected to the metal layer ML. That is, the collimation layer CL11 is floating. Even in that case, by applying the same structure as in the present embodiment to the light shielding layer LS1, collimation layer CL11, and sensor SS, and the like, the same advantages as in the present embodiment can be achieved.

Second Embodiment

Figure 9:
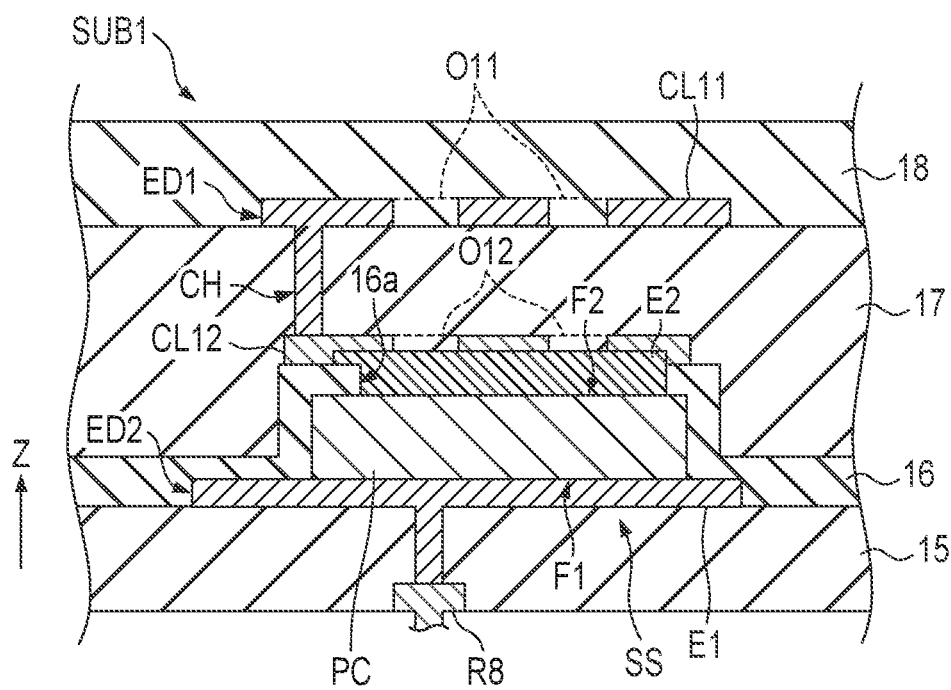
FIG. 9 is a schematic cross-sectional view of a display device of a second embodiment.

FIG. 9 is a schematic cross-sectional view of a display device of a second embodiment. In this example, a part of the first substrate SUB1 is shown. The other part is the same as that of the first embodiment.

The first substrate SUB1 of FIG. 9 differs from the first substrate SUB1 of FIG. 5 in respect of a collimation layer CL12 (second collimation layer) instead of the metal layer ML. The collimation layer CL12 is formed of a metal material as with the metal layer ML, and is positioned between the sensor SS and the collimation layer CL11. The collimation layers CL11 and CL12 are opposed to each other with the insulating layer 17 interposed therebetween. The collimation layer CL11 contacts the collimation layer CL12 through a contact hole CH. Thus, the collimation layer CL11 is electrically connected to the collimation layer CL12 and the second electrode E2.

The collimation layer CL12 includes a pair of openings O12 (second openings), and covers the surface of the sensor SS except for the area of the openings O12 (surface of the second electrode E2). The openings O12 overlap with the opening O11 in the third direction Z. Although this is not shown in FIG. 9, the openings O12 overlap with the openings O21 and O22. For example, the opening O12 is a circle size of which is the same as the opening O11 of FIG. 6, and is smaller than the openings O21 and O22.

Figure 10:
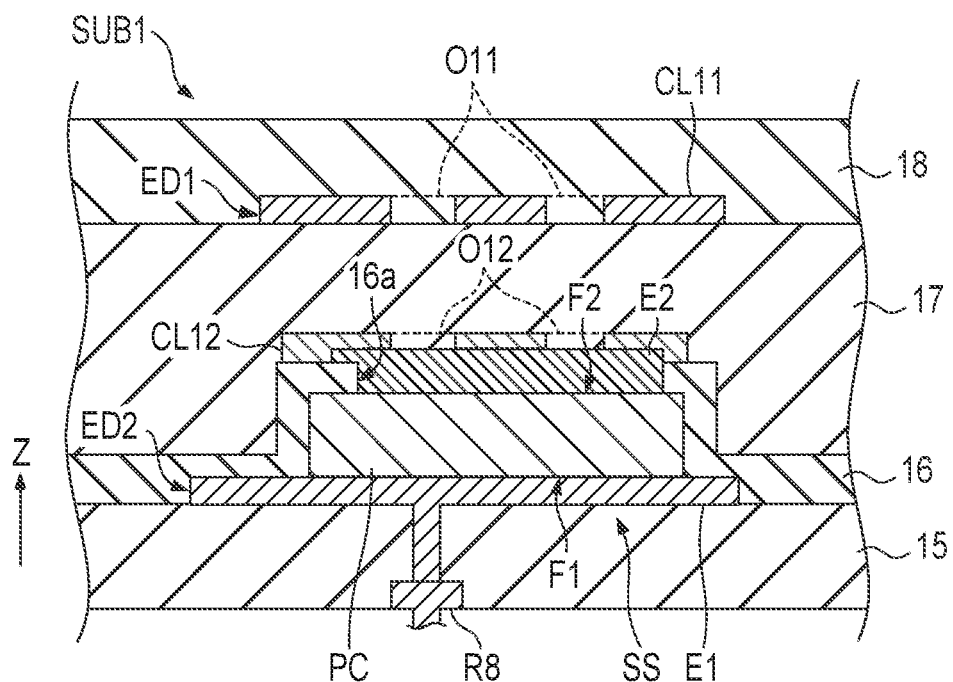
FIG. 10 is a schematic cross-sectional view of another structure applicable to the first substrate.

FIG. 10 is a schematic cross-sectional view of another structure applicable to the first substrate SUB1. In the figure, the shape of the collimation layer CL12 is the same as that of the example of FIG. 9 while the collimation layer CL11 is not connected to the collimation layer CL12.

In the structures illustrated in FIGS. 9 and 10, the second electrode E2 is mostly covered with the collimation layer CL12. Thus, even if light from the illumination device BL is reflected by the lower surface of the collimation layer CL11, the reflection light is not easily incident on the photoelectric conversion element PC. Thus, accuracy of the detection by the sensors SS is further improved.

Third Embodiment

Figure 11:
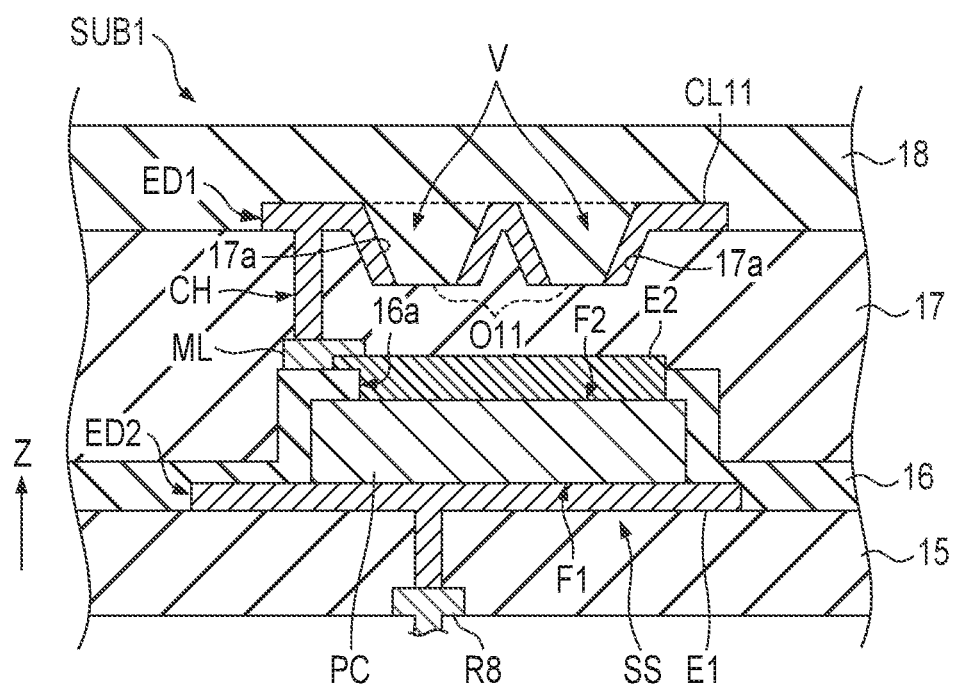
FIG. 11 is a schematic cross-sectional view of a display device of a third embodiment.

FIG. 11 is a schematic cross-sectional view of a display device DSP of a third embodiment. In this example, a part of the first substrate SUB1 is shown. The other part is the same as that of the first embodiment.

The first substrate SUB1 of FIG. 11 differs from the first substrate SUB1 of FIG. 5 in respect of the shape of the collimation layer CL11. That is, in the example of FIG. 11, the collimation layer CL11 includes a pair of inclined parts V extending toward the sensor SS.

The inclined parts V is shaped as a ring surrounding the opening O11. The opening O11 is positioned in the tip of the inclined parts V in the sensor SS side. The upper surface and the lower surface of the inclined parts V are inclined with respect to the third direction Z. In the example of FIG. 11, widths of the inclined parts V (inner diameter and outer diameter) become gradually smaller toward the sensor SS.

Each inclined part V is formed along the inner peripheral surface of a concave part 17*a* provided with the insulating layer 17. That is, the collimation layer CL11 includes the opening O11 in the bottom surface of the concave part 17*a*.

The concave part 17*a* is formed, in a manufacturing process to form a contact hole CH of FIG. 11, or a contact hole used to connect the relay electrode R4 to the relay electrode R3 of FIG. 5, through half exposure or gradation exposure such that the concave part 17*a* does not pass through the insulating layer 17.

For another example, the concave part 17*a* may pass through the insulating layer 17. In that case, the tip of the inclined parts V may contact the second electrode E2. Furthermore, for yet another example, the insulating layer 17 may include one concave part 17*a* of large diameter, and the collimation layer CL11 may include one inclined part V of large diameter along the concave part 17*a* such that two openings O11 are surrounded by the inclined part V.

Figure 12:
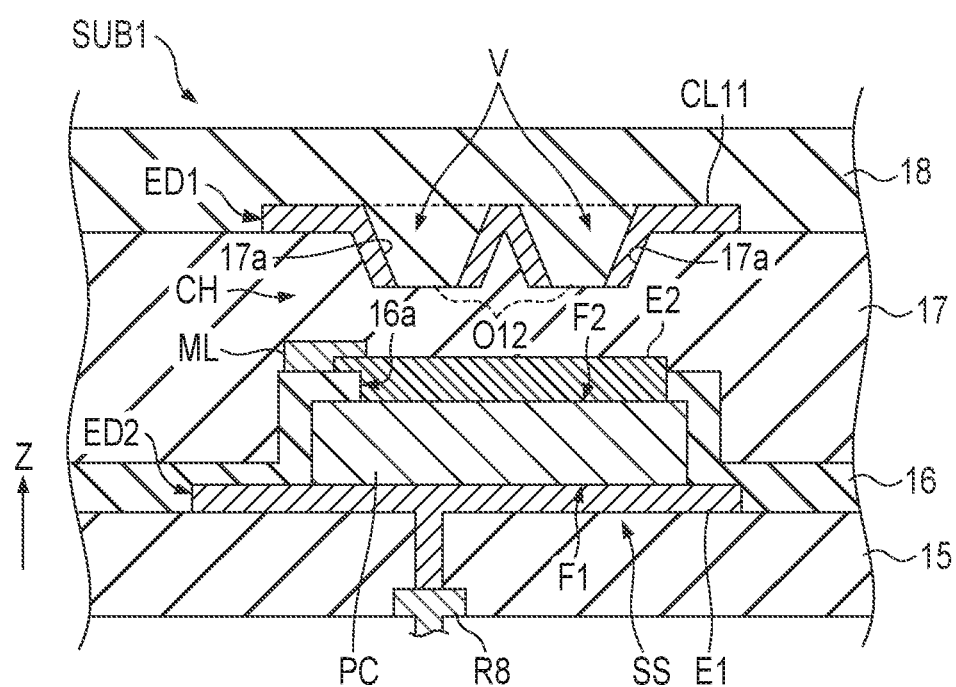
FIG. 12 is a schematic cross-sectional view of another structure applicable to the first substrate.

FIG. 12 is a schematic cross-sectional view of another structure applicable to the first substrate SUB1. In the figure depicted, the shape of the collimation layer CL11 is the same as with the example of FIG. 11 while the collimation layer CL11 is not connected to the metal layer ML.

In the above structures of FIGS. 11 and 12, each collimation layer CL11 includes an inclined part V. Thus, even if light from the illumination device BL hits the lower surface of the collimation layer CL11, the light is not easily reflected to the photoelectric conversion element PC. Thus, noise which may be sensed by the sensors can further be reduced.

Note that, in the structures of FIGS. 11 and 12, the collimation layer CL12 of the second embodiment may be arranged instead of the metal layer ML.

Based on the display device which has been described in the above-described embodiments, a person having ordinary skill in the art may achieve a display device with an arbitral design change; however, as long as they fall within the scope and spirit of the present invention, such a display device shall be encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and alteration are encompassed by the scope of the present invention.

Further, regarding the present embodiments, any advantage and effect those will be obvious from the description of the specification or arbitrarily conceived by a skilled person are naturally considered achievable by the present invention.

What is claimed is:

1. A liquid crystal display device, comprising:
a first substrate;
a second substrate opposed to the first substrate; and
a liquid crystal layer between the first substrate and the second substrate, wherein
the first substrate includes:
   a base member;
   a sensor between the base member and the liquid crystal layer in a display area with pixels, the sensor configured to output a detection signal corresponding to light incident from a liquid crystal layer side;
   a first collimation layer between the sensor and the liquid crystal layer, the first collimation layer having a first opening overlapping with the sensor;
   an insulating layer between the sensor and the first collimation layer; and
   a light shielding layer between the sensor and the base member, the light shielding layer overlapping with an outer peripheral part of the first collimation layer, wherein
the sensor includes:
   a photoelectric conversion element including a first surface opposed to the base member and a second surface opposed to the liquid crystal layer;
   a first electrode contacting the first surface; and
   a second electrode contacting the second surface, wherein
the light shielding layer overlaps with an outer peripheral part of the first electrode, and
the first collimation layer is formed of a metal material and is electrically connected to the second electrode.

2. The liquid crystal display device of claim 1, wherein the first electrode is formed of a metal material, and
the second electrode is formed of a transparent conductive material.

3. The liquid crystal display device of claim 1, wherein the first substrate further includes a second collimation layer covering a surface of the second electrode, and
the second collimation layer includes a second opening overlapping with the first opening.

4. The liquid crystal display device of claim 1, wherein the first collimation layer includes an inclined part extending toward the sensor, and
the inclined part surrounds the first opening.

5. The liquid crystal display device of claim 1, wherein the first substrate further includes a pixel electrode formed of a transparent conductive material, and
the sensor, the first collimation layer, and the light shielding layer overlap with the pixel electrode.

6. The liquid crystal display device of claim 5, wherein the pixel electrode overlaps with at least a part of the first opening.

7. The liquid crystal display device of claim 1, wherein the second substrate includes a third collimation layer opposed to the first collimation layer, and
the third collimation layer includes a third opening overlapping with the first opening, which is smaller than the first opening.

8. The liquid crystal display device of claim 1, wherein the first substrate further includes a switching element electrically connected to the sensor, and
the switching element includes a semiconductor layer at least a part of which is positioned between the light shielding layer and the sensor.

9. The liquid crystal display device of claim 1, further comprising:
an illumination device configured to illuminate light onto the first substrate, wherein
the sensor outputs, when an object is opposed to the second substrate, the detection signal corresponding to the light reflected by the object and incident thereon through the first opening.

10. A liquid crystal display device comprising:
a first substrate;
a second substrate opposed to the first substrate; and
a liquid crystal layer between the first substrate and the second substrate, wherein
the first substrate includes:
   a base member;
   a sensor between the base member and the liquid crystal layer in a display area with pixels, the sensor configured to output a detection signal corresponding to light incident from a liquid crystal layer side;
   a first collimation layer between the sensor and the liquid crystal layer, the first collimation layer having a first opening overlapping with the sensor;
   a second collimation layer between the sensor and the first collimation layer, the second collimation layer covering a surface of the sensor and having a second opening overlapping with the first opening; and
   an insulating layer between the first collimation layer and the second collimation layer, and
the first collimation layer is electrically connected to the second collimation layer.

11. The liquid crystal display device of claim 10, wherein the sensor includes:
   a photoelectric conversion element including a first surface opposed to the base member and a second surface opposed to the liquid crystal layer;
   a first electrode contacting the first surface; and
   a second electrode contacting the second surface, wherein
the second collimation layer covers the second electrode.

12. The liquid crystal display device of claim 10, further comprising:
an illumination device configured to illuminate light onto the first substrate, wherein
the sensor outputs, when an object is opposed to the second substrate, the detection signal corresponding to the light reflected by the object and incident thereon through the first opening.

13. A liquid crystal display device comprising:
a first substrate;
a second substrate opposed to the first substrate; and
a liquid crystal layer between the first substrate and the second substrate, wherein
the first substrate includes:
   a base member;
   a sensor between the base member and the liquid crystal layer in a display area with pixels, the sensor configured to output a detection signal corresponding to light incident from a liquid crystal layer side;
   a first collimation layer between the sensor and the liquid crystal layer, the first collimation layer having a first opening overlapping with the sensor; and an insulating layer between the sensor and the first collimation layer, wherein the sensor includes:
- a photoelectric conversion element including a first surface opposed to the base member and a second surface opposed to the liquid crystal layer;
- a first electrode contacting the first surface; and
- a second electrode contacting the second surface, wherein the first collimation layer includes an inclined part extending toward the sensor, the inclined part surrounds the first opening, and the first collimation layer is formed of a metal material and is electrically connected to the second electrode.

14. The liquid crystal display device of claim 13, wherein a width of the inclined part gradually decreases toward the sensor.

15. The liquid crystal display device of claim 13, wherein the inclined part is formed along an inner peripheral surface of a concave part provided with the insulating layer.

16. The liquid crystal display device of claim 13, further comprising:
- an illumination device configured to illuminate light onto the first substrate, wherein
- the sensor outputs, when an object is opposed to the second substrate, the detection signal corresponding to the light reflected by the object and incident thereon through the first opening.

* * * * *